(12) United States Patent
Huang et al.

(10) Patent No.: US 12,401,934 B2
(45) Date of Patent: **\*Aug. 26, 2025**

(54) SEMICONDUCTOR DEVICE PACKAGE AND ACOUSTIC DEVICE HAVING THE SAME

(71) Applicant: Advanced Semiconductor Engineering, Inc., Kaohsiung (TW)

(72) Inventors: Ming-Tau Huang, Kaohsiung (TW); Kuei-Hao Tseng, Kaohsiung (TW); Hung-I Lin, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 176 days.

This patent is subject to a terminal disclaimer.

(21) Appl. No.: 17/968,725

(22) Filed: Oct. 18, 2022

(65) Prior Publication Data
US 2023/0039552 A1    Feb. 9, 2023

Related U.S. Application Data

(63) Continuation of application No. 16/528,338, filed on Jul. 31, 2019, now Pat. No. 11,477,559.

(51) Int. Cl.
*H04R 1/10* (2006.01)
*B81B 7/00* (2006.01)

(52) U.S. Cl.
CPC ........... *H04R 1/1016* (2013.01); *B81B 7/008* (2013.01); *H04R 2201/003* (2013.01)

(58) Field of Classification Search
CPC .. H04R 1/1016; H04R 2201/003; B81B 7/008

USPC .......... 381/74, 58, 151, 311, 380, 374, 150; 438/106, 107, 112; 343/791, 866; 455/572; 320/127, 128, 137
See application file for complete search history.

(56) References Cited

U.S. PATENT DOCUMENTS

7,570,218 B2    8/2009  Tsujimura et al.
8,315,060 B2    11/2012  Morikita et al.
(Continued)

FOREIGN PATENT DOCUMENTS

CN    107623881 A    1/2018
CN    208754499 U    4/2019
(Continued)

OTHER PUBLICATIONS

First Office Action, with English summary for counterpart Japanese Patent Application No. 2019-198831, issued Oct. 31, 2023, 9 pages.
(Continued)

*Primary Examiner* — Vivian C Chin
*Assistant Examiner* — Con P Tran
(74) *Attorney, Agent, or Firm* — FOLEY & LARDNER LLP

(57) ABSTRACT

A semiconductor device package comprises a first substrate, a first electronic component, an encapsulant, and a feeding structure. The first substrate has a first surface and a second surface opposite the first surface. The first electronic component is disposed on the first surface of the first substrate. The encapsulant encapsulates the first electronic component on the first surface of the first substrate. The feeding structure is disposed on the second surface of the first substrate without covering.

20 Claims, 10 Drawing Sheets

(56) References Cited

U.S. PATENT DOCUMENTS

| | | |
|---|---|---|
| 9,118,990 B2 | 8/2015 | Hankey et al. |
| 9,932,221 B1 | 4/2018 | Natan et al. |
| 10,049,893 B2 | 8/2018 | Chen et al. |
| 11,477,559 B2 | 10/2022 | Huang et al. |
| 2003/0169209 A1 | 9/2003 | Ohara et al. |
| 2004/0084771 A1 | 5/2004 | Bolken et al. |
| 2007/0029667 A1 | 2/2007 | Fujii et al. |
| 2007/0080360 A1 | 4/2007 | Mirsky et al. |
| 2008/0164545 A1 | 7/2008 | Hsiao |
| 2012/0049348 A1 | 3/2012 | Ro |
| 2014/0198927 A1 | 7/2014 | Cheng |
| 2015/0350762 A1 | 12/2015 | Birger et al. |
| 2016/0050474 A1 | 2/2016 | Rye et al. |
| 2016/0073189 A1 | 3/2016 | Linden et al. |
| 2016/0225745 A1 | 8/2016 | Beer et al. |
| 2017/0195767 A1 | 7/2017 | Kim et al. |
| 2017/0209095 A1 | 7/2017 | Wagner et al. |
| 2017/0330870 A1 | 11/2017 | Chen et al. |
| 2018/0323170 A1 | 11/2018 | Kim et al. |
| 2019/0045294 A1 | 2/2019 | Kim et al. |
| 2020/0221210 A1* | 7/2020 | Grebe .................. H01Q 1/40 |

FOREIGN PATENT DOCUMENTS

| | | |
|---|---|---|
| JP | 2001-217332 A | 8/2001 |
| JP | 2001-352212 A | 12/2001 |
| JP | 2007-042978 A | 2/2007 |
| JP | 2007-288360 A | 11/2007 |
| JP | 2010-516096 A | 5/2010 |
| JP | 2011-097306 A | 5/2011 |
| JP | 2012-074505 A | 4/2012 |
| JP | 2017-204635 A | 11/2017 |
| JP | 2021-027308 A | 2/2021 |
| WO | WO-2005/067359 A1 | 7/2005 |
| WO | WO-2009/122835 A1 | 10/2009 |
| WO | WO-2015/068403 A1 | 5/2015 |

OTHER PUBLICATIONS

Extended Search Report for corresponding European Patent Application No. 19204047.5, issued on Jun. 5, 2020, 7 pages.
Final Office Action U.S. Appl. No. 16/528,338, issued Nov. 10, 2020, 39 pages.
Final Office Action U.S. Appl. No. 16/528,338, issued, Sep. 14, 2021, 46 pages.
Non-Final Office Action for U.S. Appl. No. 16/528,338, issued May 29, 2020, 20 pages.
Non-Final Office Action U.S. Appl. No. 16/528,338, issued Feb. 3, 2022, 16 pages.
Non-Final Office Action U.S. Appl. No. 16/528,338, issued Mar. 22, 2021, 37 pages.
Notice of Allowance U.S. Appl. No. 16/528,338, issued Jun. 13, 2022, 9 pages.
Office Action for corresponding European Patent Application No. 19204047.5, issued on Jun. 21, 2021, 6 pages.
Office Action, for counterpart Chinese Patent Application No. 201910764286.3, issued Nov. 28, 2024, 7 pages.
Search Report with English translation, counterpart Chinese Patent Application No. 201910764286.3, issued Nov. 28, 2024, 4 pages.
Office Action, for counterpart Japanese Patent Application No. 2024-063839, issued Mar. 5, 2025, 5 pages.
Summary with English Translation of Office Action, for counterpart Japanese Patent Application No. 2024-063839, issued Mar. 5, 2025, 1 page.
Office Action for counterpart European Patent Application No. 19204047.5, issued Jan. 24, 2025, 8 pages.
Search Report with English translation for Chinese Application No. 201910764286.3 dated Jul. 7, 2025, 4 pages.

* cited by examiner

SEMICONDUCTOR DEVICE PACKAGE AND ACOUSTIC DEVICE HAVING THE SAME

CROSS-REFERENCE TO RELATED APPLICATION

This application is a continuation of U.S. patent application Ser. No. 16/528,338 filed Jul. 31, 2019, now issued as U.S. Pat. No. 11,477,559, the contents of which is incorporated herein by reference in its entirety.

BACKGROUND

1. Technical Field

The present disclosure relates generally to a semiconductor device package, and more particularly, the present disclosure relates to an acoustic device having the semiconductor device package.

2. Description of the Related Art

As technology advances, various circuits or modules can be integrated into one electronic device, e.g. an acoustic device (e.g. an earphone or a wireless earphone) to perform multifunction. However, miniaturization of the electronic device may adversely affect performance of the electronic device.

SUMMARY

In some embodiments, the present disclosure provides a semiconductor device package. The semiconductor device package includes a first substrate, a first electronic component, an encapsulant and a feeding structure. The substrate has a first surface and a second surface opposite the first surface. The first electronic component is disposed on the first surface of the first substrate. The encapsulant encapsulates the first electronic component on the first surface of the first substrate. The feeding structure is disposed on the second surface of the first substrate without covering.

In some embodiments, the present disclosure further provides a wireless earphone. The wireless earphone includes a semiconductor device package. The semiconductor device package includes a first substrate, a first electronic component, an encapsulant and a feeding structure. The substrate has a first surface and a second surface opposite the first surface. The first electronic component is disposed on the first surface of the first substrate. The encapsulant encapsulates the first electronic component on the first surface of the first substrate. The feeding structure is disposed on the second surface of the first substrate without covering.

In some embodiments, the present disclosure provides a semiconductor device package manufacturing method. The method includes providing a substrate having a first surface and a second surface opposite the first surface. The method also includes disposing a first semiconductor device on the first surface of the substrate. The method further includes encapsulating the first semiconductor device on the first surface of the substrate. The method also includes disposing a feeding structure on the second surface of the substrate. The method further includes exposing the feeding structure.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
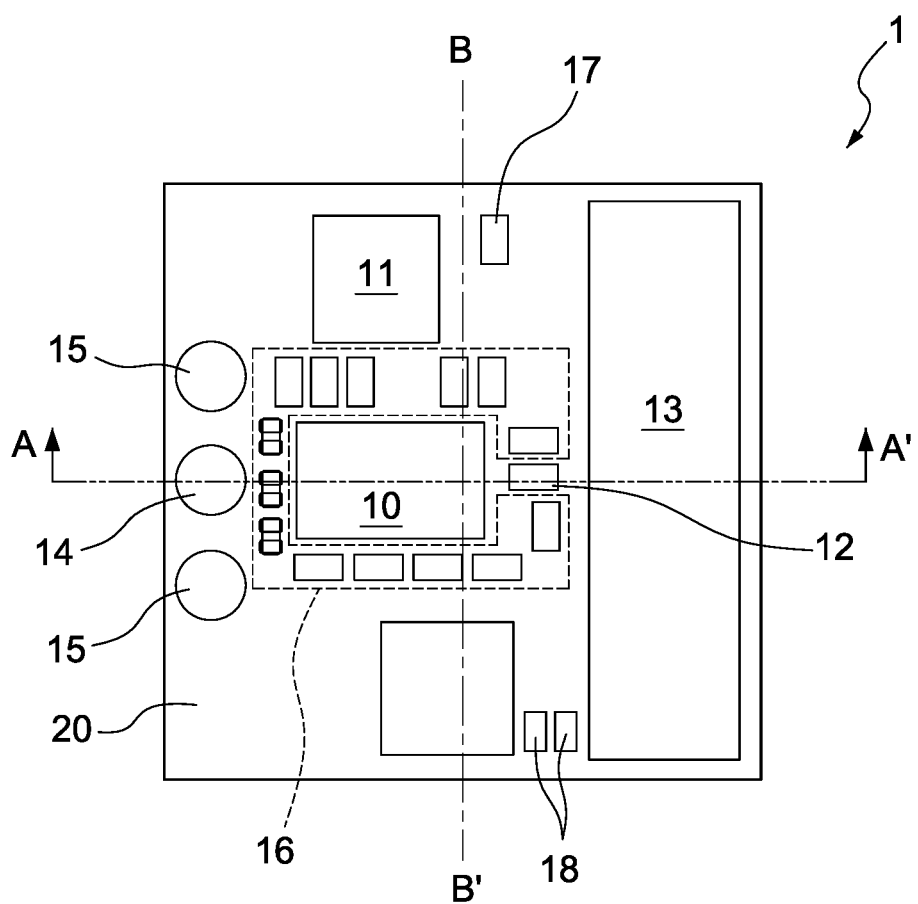
FIG. 1 illustrates a layout of a semiconductor device package in accordance with some embodiments of the present disclosure.

FIG. 1 illustrates a layout of a semiconductor device package 1. The semiconductor device package 1 can have a substrate 20, a microphone 10, a controller 11, a sensor 12, a connector 13, a feeding structure 14, ground pads 15 and electronic components 16.

The microphone 10, controller 11, sensor 12, connector 13, feeding structure 14, ground pads 15 and electronic components 16 can be formed on the same side of the semiconductor device package 1.

The microphone 10 is exposed on the substrate 20. The controller 11 is exposed on the substrate 20. The sensor 12 is exposed on the substrate 20. The connector 13 is exposed on the substrate 20. The feeding structure 14 is exposed on the substrate 20. The ground pads 15 are exposed on the substrate 20. The electronic components 16 are exposed on the substrate 20. A conductive pad 17 is disposed on the substrate 20. Conductive pads 18 are disposed on the substrate 20. The conductive pad 17 is exposed on the substrate 20. The conductive pads 18 are exposed on the substrate 20. The conductive pad 17 can be configured or used to connect the battery and the semiconductor device package 1. The conductive pad 18 can be configured or used to connect the speaker and the semiconductor device package 1. The semiconductor device package 1 can include a printed circuit board assembly. Semiconductor devices or semiconductor device packages can be mounted on the semiconductor device package 1. The semiconductor device package 1 can be referred to as a system on module (SOM).

A line A-A' may pass center of the semiconductor device package 1. The line A-A' may pass center of a surface (e.g. top surface, not denoted in FIG. 1) of the substrate 20. The line A-A' may pass the microphone 10 of the substrate 20. The line A-A' may pass the feeding structure 14 of the substrate 20.

A line B-B' may pass center of the semiconductor device package 1. The line B-B' may pass center of the surface of the substrate 20. The line B-B' may pass the microphone 10 of the substrate 20. As shown in FIG. 1, the microphone 10 can be disposed adjacent to the line A-A' of the surface of the substrate 20. The microphone 10 can be disposed adjacent to the line B-B' of the surface of the substrate 20. The feeding structure 14 may be disposed adjacent to the line A-A' of the surface of the substrate 20.

One of the benefits of the layout of the components of the semiconductor device package 1 may include an arrangement of the microphone 10 to be adjacent to or on the center of the top surface (not denoted in FIG. 1) of the substrate 20, which can fit or be used or be assembled in different housings (e.g. a housing for right ear and another housing for left ear).

One of the benefits of the layout of the components of the semiconductor device package 1 may include an arrangement of the feeding structure 14 to be adjacent to or on the center of the top surface (not denoted in FIG. 1) of the substrate 20, which can fit or be used or be assembled in different housings (e.g. a housing for right ear and another housing for left ear).

Figure 2A:
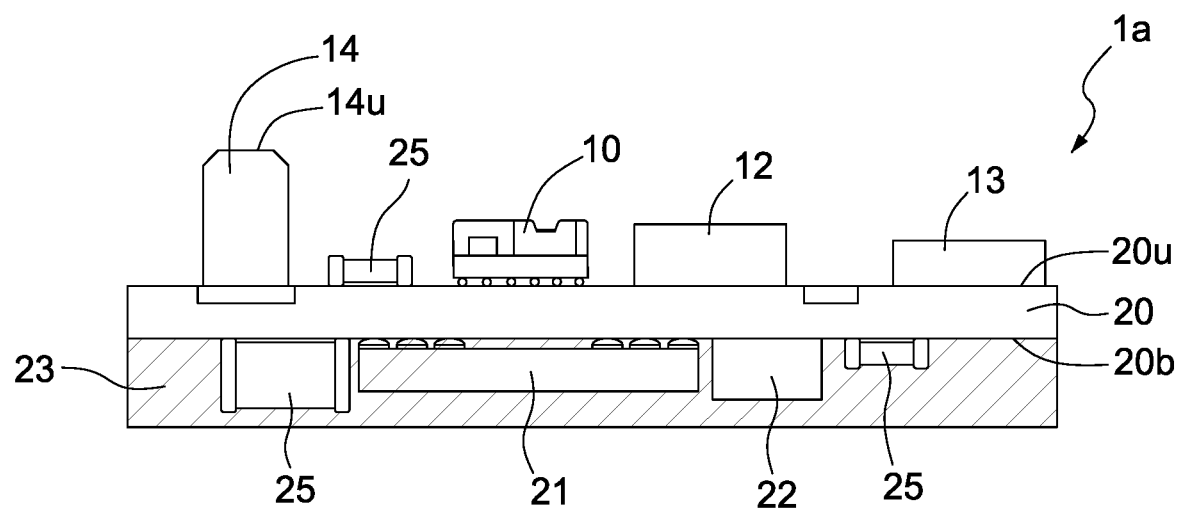
FIG. 2A illustrates a cross-sectional view of line A-A' of the semiconductor device package shown in FIG. 1.

FIG. 2A illustrates a cross-sectional view across line A-A' as shown in FIG. 1. A semiconductor device package 1a can include a substrate 20, an electronic component 21, another electronic component 22, an encapsulant 23 and a feeding structure 14.

The substrate 20 has a surface 20b and a surface 20u opposite the surface 20b.

The semiconductor device 21 can be disposed on the surface 20b of the substrate 20. The electronic component 22 can be disposed on the surface 20b of the substrate 20. The encapsulant 23 can encapsulate the electronic component 21 on the surface 20b of the substrate 20. The encapsulant 23 can encapsulate the electronic component 22 on the surface 20b of the substrate 20.

The feeding structure 14 can be disposed on the surface 20u of the substrate 20 and is devoid of encapsulant or molding material. The feeding structure 14 is exposed on the surface 20u of the substrate 20. The surface 20u of the substrate 20 is devoid of encapsulant or molding material. Electronic components 25 are disposed on both surfaces 20b and 20u of the substrate 20. The microphone 10 is disposed on the surface 20u. The microphone 10 may include a semiconductor device package. The microphone 10 may include a microelectromechanical systems (MEMS) device. The microphone 10 may include a microelectromechanical systems (MEMS) device package. The microphone 10 is exposed. The sensor 12 is disposed on the surface 20u of the substrate 20. The connector 13 is disposed on the surface 20u of the substrate 20. The surface 20b includes conductive pads for battery connection. The surface 20b includes conductive pads for speaker driver connection. The feeding structure 14 has a surface 14u higher than the electronic microphone 10. The surface 14u is higher than the sensor 12. The surface 14u is higher than the connector 13. The feeding structure 14 is the highest among elements disposed on the surface 20u of the substrate 20.

The electronic components 21 and 22 may include one or more of application processors, memories, digital signal processors, coders/decoders, power management integrated circuits, DC converters, low dropout outputs or filters. The encapsulant 23 may include different kinds of molding materials. The feeding structure 14 includes a spring or a conductive pin. The feeding structure 14 includes a POGO pin. The feeding structure 14 also includes an antioxidation layer. The feeding structure 14 is configured to and can be used to feed a radio frequency (RF) signal to an antenna. The electronic components 25 may include one or more of resistors, inductors or capacitors. The sensor 12 may include a G-sensor or other sensors. The connector 13 includes a zero insertion force connector or a board-to-board connector for peripheral function flexible printed circuit (FPC) connection.

Figure 2B:
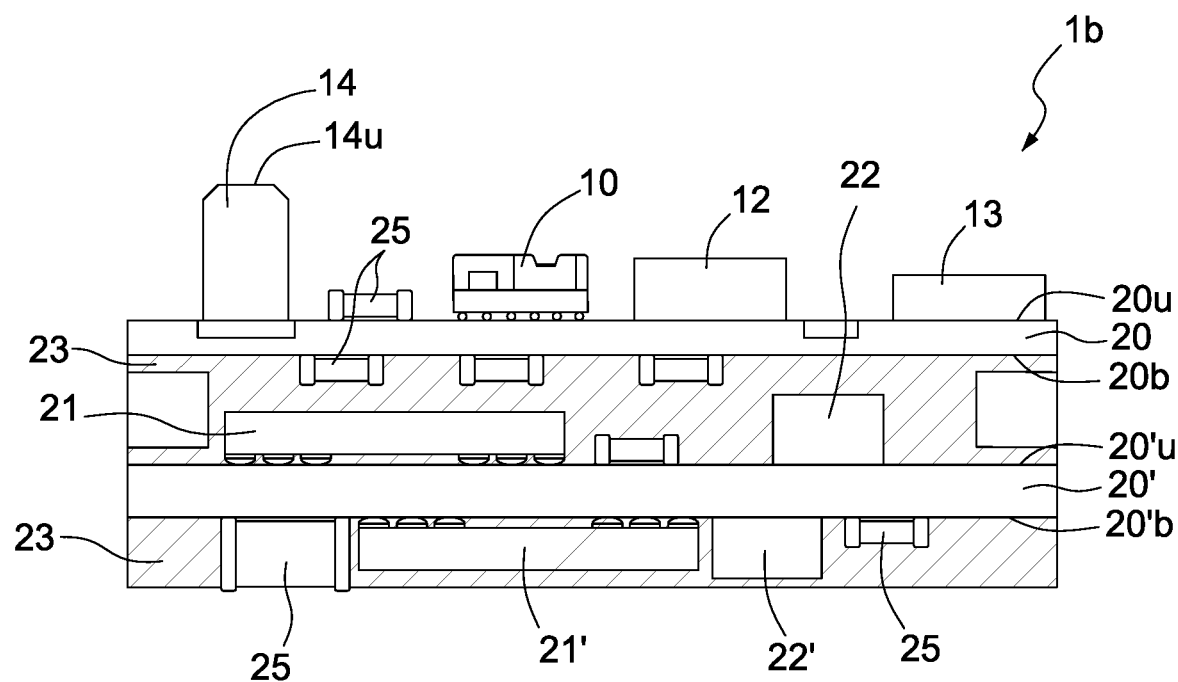
FIG. 2B illustrates a cross-sectional view of line A-A' of the semiconductor device package shown in FIG. 1.

FIG. 2B illustrates another cross-sectional view of line A-A' of the semiconductor device package shown in FIG. 1. Electronic component 21' is disposed on a surface 20'b of a substrate 20'. Electronic component 22' is disposed on the surface 20'b of the substrate 20'. The surface 20'u is opposite to the surface 20'b of the substrate 20'. Electronic components 25 are disposed on both surfaces 20'b and 20'u of the substrate 20'. Encapsulant 23 surrounds the elements disposed on the surface 20'b of the substrate 20'. A substrate 20 has a surface 20b and a surface 20u opposite the surface 20b. A feeding structure 14 is disposed on the surface 20u of the substrate 20. The feeding structure 14 is exposed. The surface 20u of the substrate 20 is devoid of encapsulant or molding material. Electronic components 25 are disposed on both surfaces 20b and 20u of the substrate 20. A microphone 10 is disposed on the surface 20u. The microphone 10 is also exposed. A sensor 12 is disposed on the surface 20u of the substrate 20. A connector 13 is disposed on the surface 20u of the substrate 20. Encapsulant 23 surrounds the elements disposed between the surface 20b of the substrate 20 and the surface 20'u of the substrate 20'.

Figure 2C:
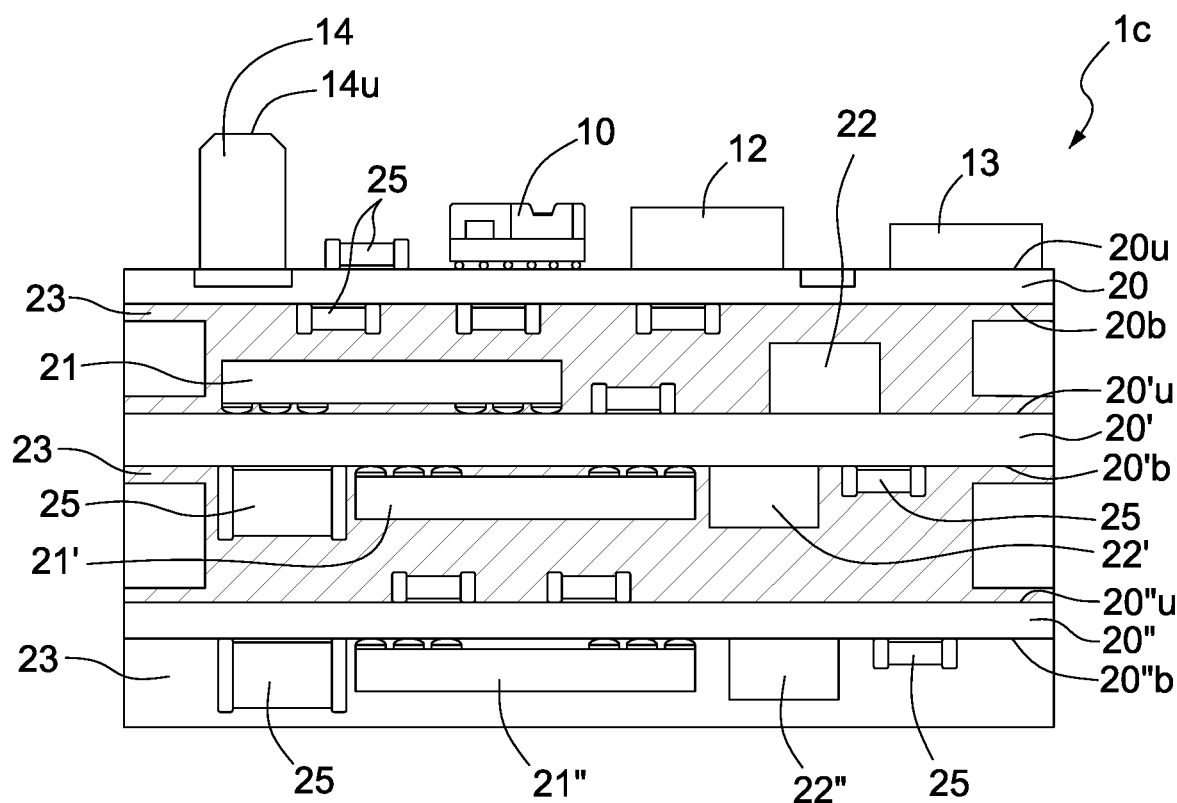
FIG. 2C illustrates a cross-sectional view of line A-A' of the semiconductor device package shown in FIG. 1.

FIG. 2C illustrates a further cross-sectional view of line A-A' of the semiconductor device package shown in FIG. 1. Electronic component 21" is disposed on a surface 20"b of a substrate 20". Electronic component 22" is disposed on the surface 20"b of the substrate 20". The surface 20"u is opposite to the surface 20"b of the substrate 20". Electronic components 25 are disposed on both surfaces 20"b and 20"u of the substrate 20". Encapsulant 23 surrounds the elements disposed on the surface 20"b of the substrate 20". Electronic component 21' is disposed on a surface 20'b of a substrate 20'. Electronic component 22' is disposed on the surface 20'b of the substrate 20'. The surface 20'u is opposite to the surface 20'b of the substrate 20'. Electronic components 25 are disposed on both surfaces 20'b and 20'u of the substrate 20'. Encapsulant 23 surrounds the elements disposed on the surface 20'b of the substrate 20'. A substrate 20 has a surface 20b and a surface 20u opposite the surface 20b. A feeding structure 14 is disposed on the surface 20u of the substrate 20. The feeding structure 14 is exposed. The surface 20u of the substrate 20 is devoid of encapsulant or molding material. Electronic components 25 are disposed on both surfaces 20b and 20u of the substrate 20. A microphone 10 is disposed on the surface 20u. The microphone 10 is also exposed. A sensor 12 is disposed on the surface 20u of the substrate 20. A connector 13 is disposed on the surface 20u of the substrate 20. Encapsulant 23 surrounds the elements disposed between the surface 20b of the substrate 20 and the surface 20'u of the substrate 20'. Encapsulant 23 also surrounds the elements disposed between the surface 20'b of the substrate 20' and the surface 20"u of the substrate 20".

Figure 2D:
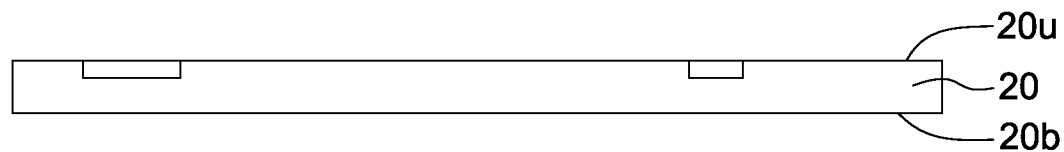
FIG. 2D, FIG. 2E, and FIG. 2F illustrate a method of manufacturing a semiconductor device package in accordance with some embodiments of the present disclosure.
Figure 2E:
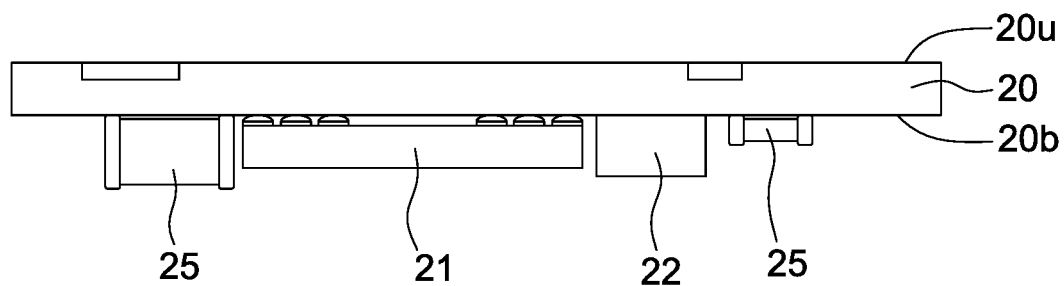
Figure 2F:
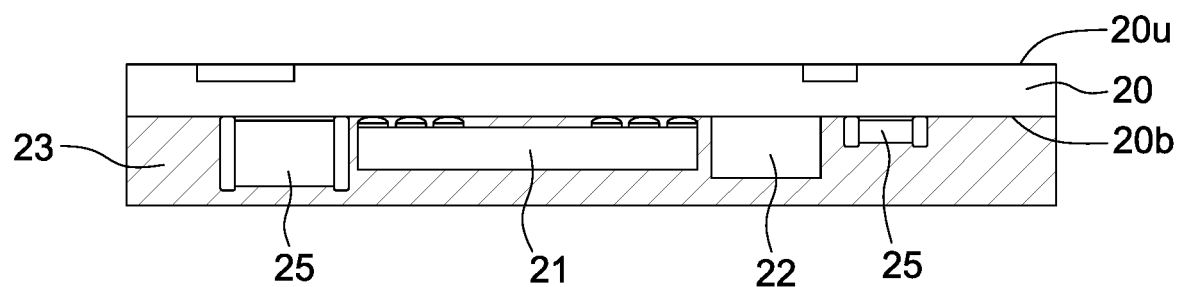

FIGS. 2D, 2E and 2F illustrates a method for manufacturing the semiconductor device package 1a shown in FIG. 2A.

As shown in FIG. 2D, a substrate 20 having a surface 20b and a surface 20u opposite the surface 20b is provided.

As shown in FIG. 2E, an electronic component 21 is disposed on the surface 20b of the substrate 20. Another electronic component 22 is also disposed on the surface 20b of the substrate 20. Electronic components 25 are disposed on both of the surfaces 20b and 20u of the substrate 20. A As shown in FIG. 2F, the electronic component 21 is encapsulated on the surface 20b of the substrate 20 by an encapsulant 23. Another electronic component 22 is encapsulated on the surface 20b of the substrate 20 by the encapsulant 23. Electronic components 25 are encapsulated on the surface 20b of the substrate 20 by the encapsulant 23. A feeding structure 14 is disposed on the surface 20u of the substrate 20. The feeding structure 14 is exposed. A microphone 10 is disposed on the surface 20u of the substrate 20. The microphone 10 is exposed. The surface 20u of the substrate 20 is also exposed. Electronic components 25 are disposed on the surface 20u of the substrate 20. A sensor 12 is disposed on the surface 20u of the substrate 20. A connector 13 is disposed on the surface 20u of the substrate 20 to form the semiconductor device package as shown in FIG. 2A.

Figure 3:
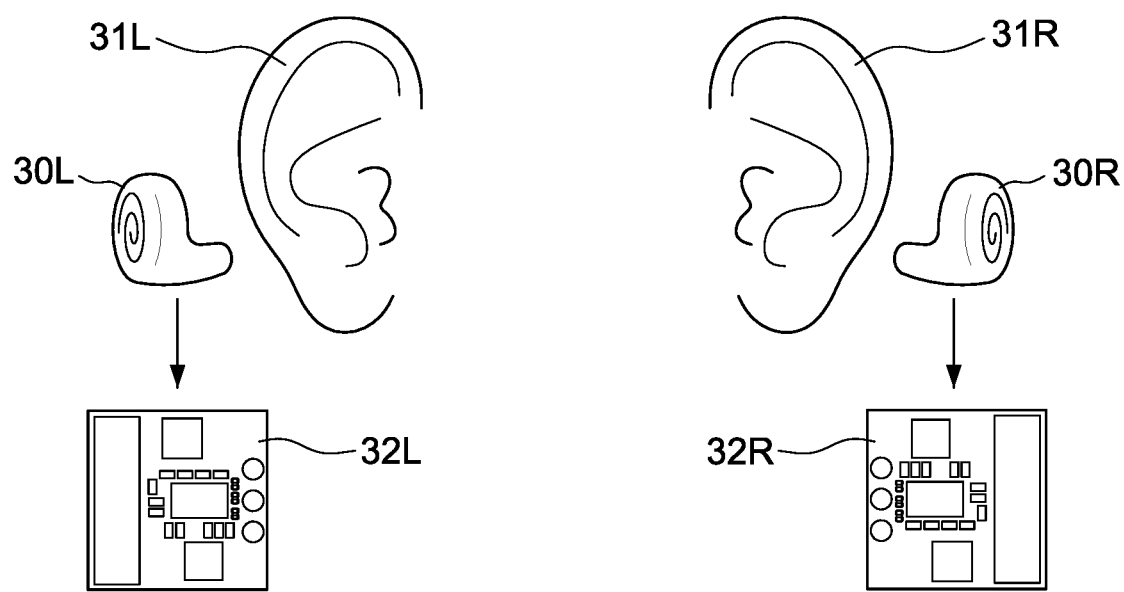
FIG. 3 illustrates application of the semiconductor device package shown in FIG. 1 in accordance with some embodiments of the present disclosure.

FIG. 3 illustrates application of semiconductor device packages of earphones. Acoustic device (e.g. earphones) 30R is plugged into human ears 31R. Acoustic device 30L is plugged into human ears 31L. The right acoustic device 30R includes semiconductor device packages 32R. The left acoustic device 30L includes semiconductor device packages 32L. The layout of the semiconductor device package 32R is the same or identical to the layout of the semiconductor device package 32L, except that the semiconductor device package 32R is rotated by substantially 180 degrees with respect to the semiconductor device package 32L after assembly. Accordingly, one layout of semiconductor device package is used for both acoustic devices 30R and 30L, which can reduce cost. The acoustic devices 30R and 30L may include the semiconductor device packages 1a, 1b or 1c shown in FIGS. 1A, 1B and 1C.

Figure 4A:
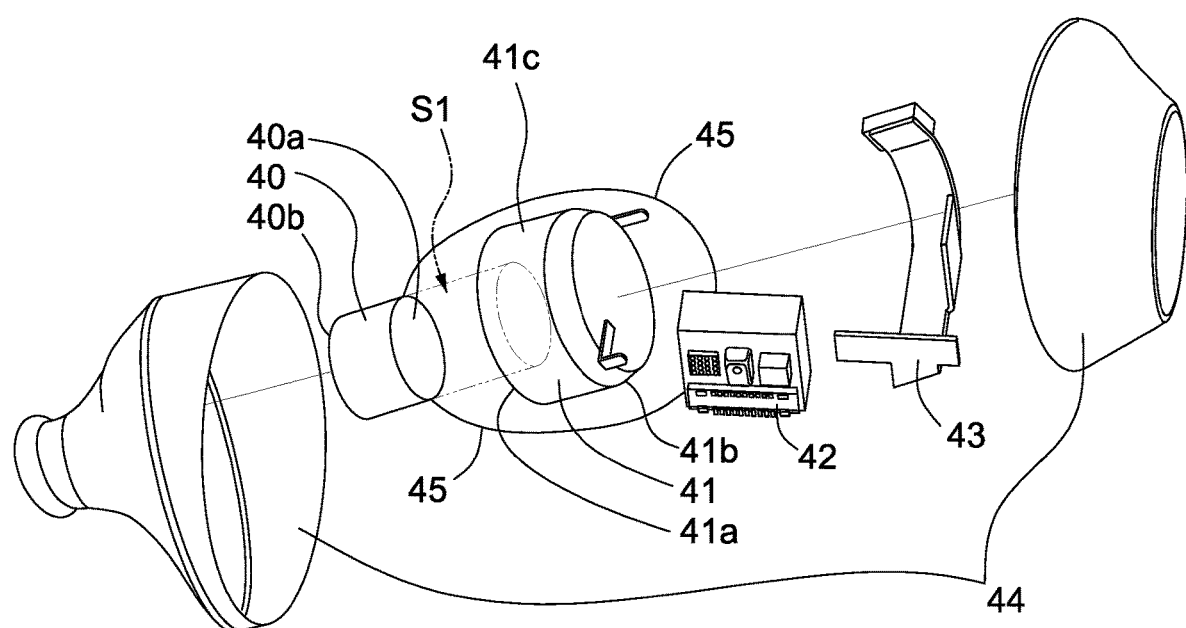
FIG. 4A illustrates an exploded view of an acoustic device in accordance with some embodiments of the present disclosure.

FIG. 4A illustrates an exploded view of an acoustic device 4 in accordance with some embodiments of the present disclosure. The acoustic device 4 includes a speaker 40, a battery 41, a semiconductor device package 42, an interconnect structure 43 and a housing 44. The speaker has a surface 40a and a surface 40b opposite to the surface 40a. The battery 41 has a surface 41a, a surface 41b opposite the surface 41a, and a surface 41c extended between the surface 41a and the surface 41b. The speaker 40 is disposed adjacent to the surface 41a of the battery 41. The surface 40a of the speaker 40 faces with the surface 41a of the battery 41. The structure of the semiconductor device package 42 is illustrated in the cross-sectional view of the semiconductor device package 1a, 1b or 1c in FIGS. 2A-2C, respectively. The speaker 40 is connected to the semiconductor device package 42 by wires 45. The wires 45 do not penetrate the battery 41. The speaker 40 is separated from the battery 41 by a space S1. There is no turbulent flow in the space S1. The space S1 can influence the acoustic performance of the acoustic device 4. The housing 44 encloses the speaker 40, the battery 41, the semiconductor device package 42, and the interconnect structure 43. The interconnect structure 43 connects the battery 41 and the semiconductor device package 42. The interconnect structure 43 includes flexible print circuit (FPCs) or other interconnect structures.

Figure 4B:
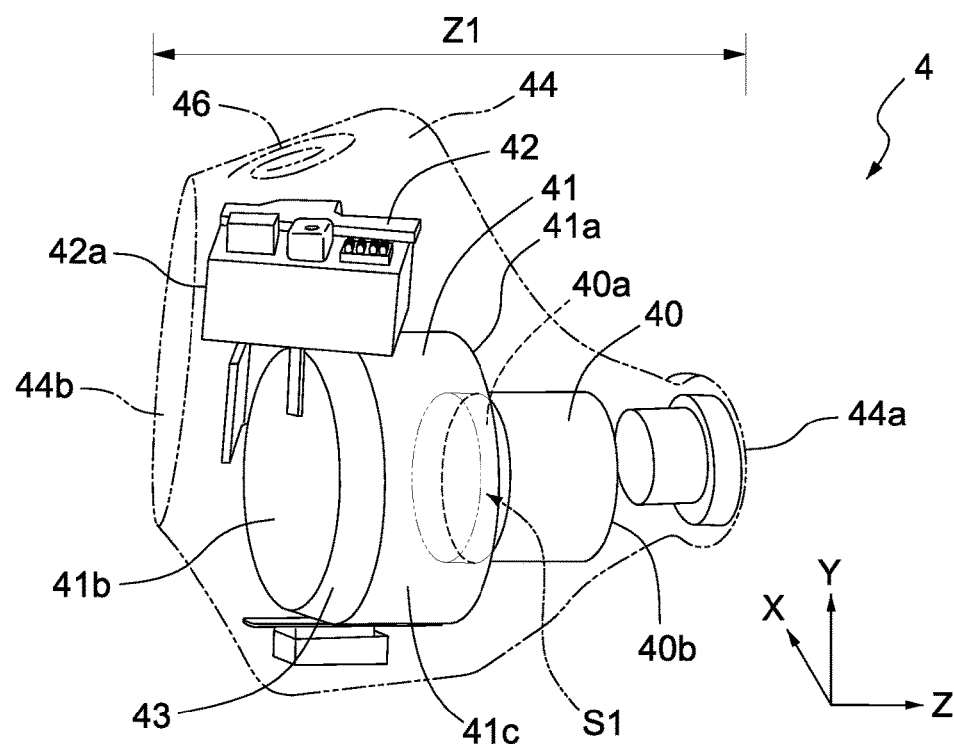
FIG. 4B illustrates a perspective view of an assembly of the acoustic device as shown in FIG. 4A.

FIG. 4B illustrates a perspective view of an assembly of the acoustic device 4 as shown in FIG. 4A. The semiconductor device package 42 is disposed adjacent to the surface 41c of the battery 41. The semiconductor device package 42 is electrically connected to the surface 41c of the battery 41 by the interconnect structure 43. The speaker 40 is separated from the surface 41a of the battery 41 by the space S1. The space S1 is devoid of electronic components. The space S1 may have a plate for separating the speaker and the battery 41. The space S1 may have conductive wires therein. The space S1 may have solely conductive wires therein. The space S1 may have no active components. The space S1 may have no passive components.

The semiconductor device package 42 is disposed between the housing 44 and the surface 41c of the battery 41. The speaker 40 has a surface 40a facing the surface 41a of the battery 41. The semiconductor device package 42 is disposed between the housing 44, the surface 41c of the battery 41 and the surface 40a of the speaker 40. The semiconductor device package 42 is surrounded by the housing 44, the surface 41c of the battery 41 and the surface 40a of the speaker 40. The semiconductor device package 42 is disposed in a space defined by the housing 44, the surface 41c of the battery 41 and the speaker 40. The housing 44 encloses the speaker 40, the battery 41 and the semiconductor device package 42. The housing 44 has an end 44a and an end 44b opposite the end 44a. Antenna patterns 46 are formed on the housing 44 to work as antennas. The feeding structure 14 may be in contact with the antenna patterns 46 of the housing 44 of the acoustic device 4.

Referring again to FIG. 4B, assuming the speaker 40 can have a width or diameter of approximately 6 mm, a maximum distance Z1 between the end 44a (which can be fitted or plugged into an ear) and the end 44b along the z axis can be equal to or less than 23 mm. For example, assuming the speaker 40 can have a width or diameter of approximately 6 mm, a distance Z1 between the end 44a (which can be fitted or plugged into an ear) and the end 44b along the z axis can be equal to or less than 20 mm. Accordingly, the semiconductor device package 42 can facilitate miniaturization of the acoustic device 4. Arrangement of the semiconductor device package 42 can facilitate miniaturization of the acoustic device 4.

For example, assuming the speaker 40 can have a width or diameter of approximately 10 mm, a distance Z1 between the end 44a (which can be fitted or plugged into an ear) and the end 44b along the z axis can be equal to approximately 23 mm.

Figure 5A:
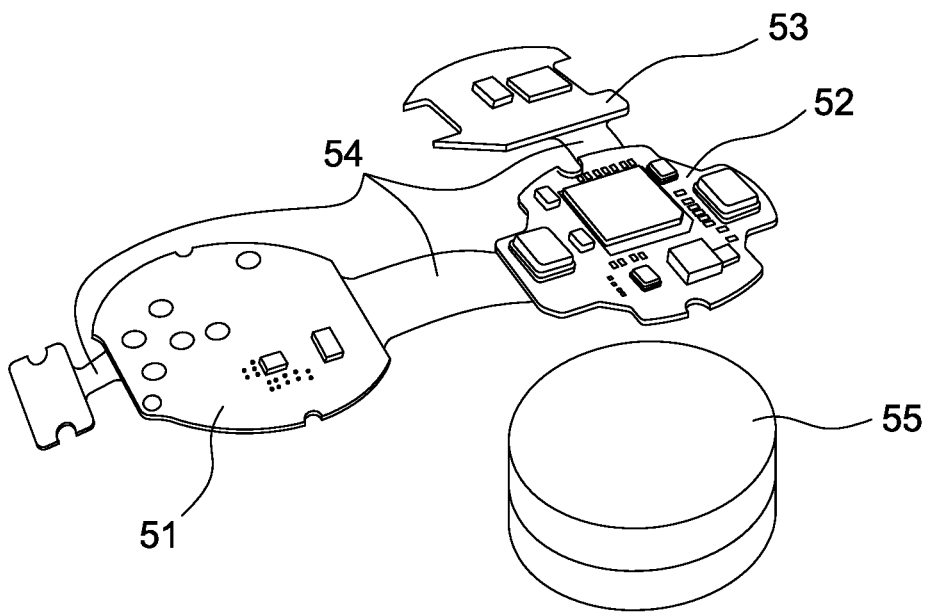
FIG. 5A illustrates an exploded view of electronic components of an acoustic device in accordance with some embodiments of the present disclosure.

FIG. 5A illustrates an exploded view of electronic components of an acoustic device. Circuit boards 51, 52 and 53 of an acoustic device are connected by an interconnect structure 54. Electronic components are formed on the circuit boards 51, 52 and 53. The interconnect structure 54 may include FPCs or other interconnect structures. A battery 55 can be provided in the acoustic device.

The acoustic device, which includes circuit boards 51, 52 and 53, can be fitted or plugged into a left ear. However, another acoustic device to be fitted or plugged into a right ear may include circuit boards each having layout different from circuit boards 51, 52 and 53, which may inevitably increase the cost.

Figure 5B:
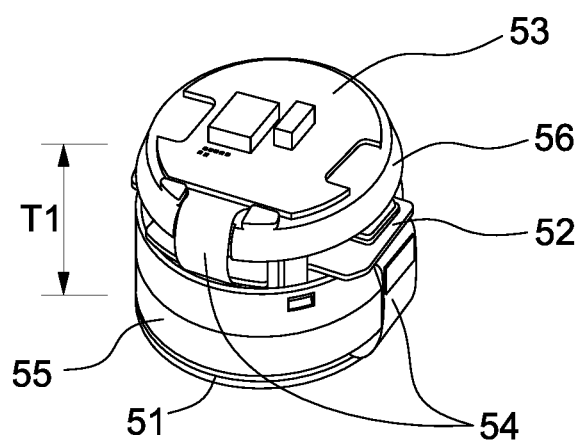
FIG. 5B illustrates an assembly of the electronic components of the acoustic device in accordance with some embodiments of the present disclosure.

FIG. 5B illustrates an assembly of the electronic components of the acoustic device in accordance with some embodiments of the present disclosure. The circuit boards 51, 52 and 53 are stacked. The thickness of the stack is T1. The circuit boards 51 and 52 and the interconnect structure 54 surround a battery 55. The circuit boards 52 and 53 and the interconnect structure 54 surround a mechanical component 56.

Figure 5C:
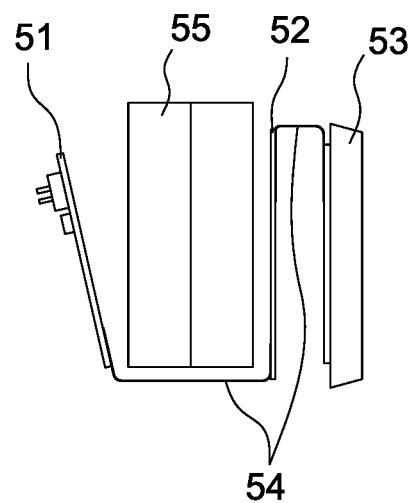
FIG. 5C illustrates a side view of the assembly of the electronic components of the acoustic device in accordance with some embodiments of the present disclosure.

FIG. 5C illustrates a side view of the assembly of the electronic components of the acoustic device. FIG. 5C shows that the circuit board 51 can be above the battery 55. The circuit board 52 can be under the battery 55. The circuit boards 51 and 52 and the interconnect structure 54 surround the battery 55. The circuit board 53 is separated from the battery 55. As shown in FIG. 5C, the mechanical component 56 may be ignored.

Figure 5D:
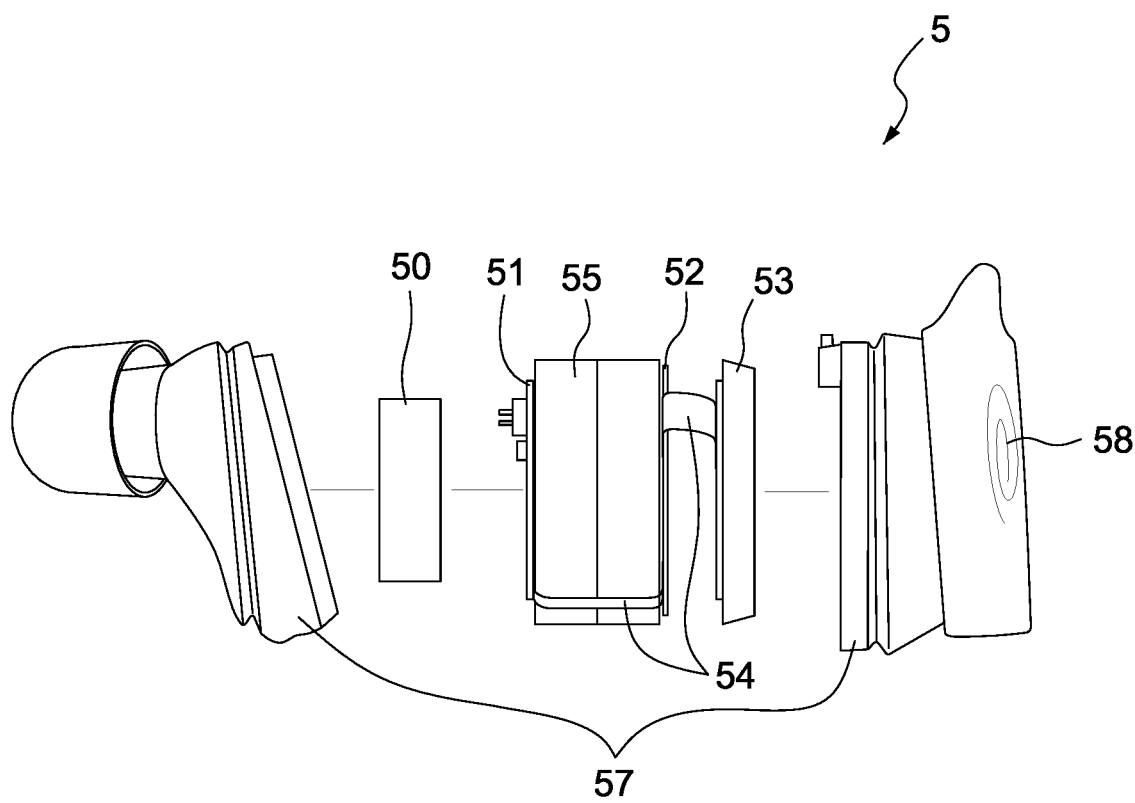
FIG. 5D illustrates an exploded view of an acoustic device in accordance with some embodiments of the present disclosure.

FIG. 5D illustrates an exploded view of an acoustic device 5 including the stack shown in FIG. 5C. The acoustic device 5 may include a speaker 50, circuit boards 51, 52 and 53, the interconnect structure 54, a battery 55 and a housing 57. The circuit board 53 is disposed between the speaker 50 and the battery 55, which causes electromagnetic interference to the speaker 50 and thus degrades the acoustic performance of the acoustic device 5. The housing 57 encloses the speaker 50, the circuit boards 51, 52 and 53, the interconnect structures 54, and the battery 55. Antenna patterns 58 are formed on the housing 57. A feeding point (not denoted in FIG. 5D) on the circuit board 53 is in contact with the antenna patterns 58.

Figure 5E:
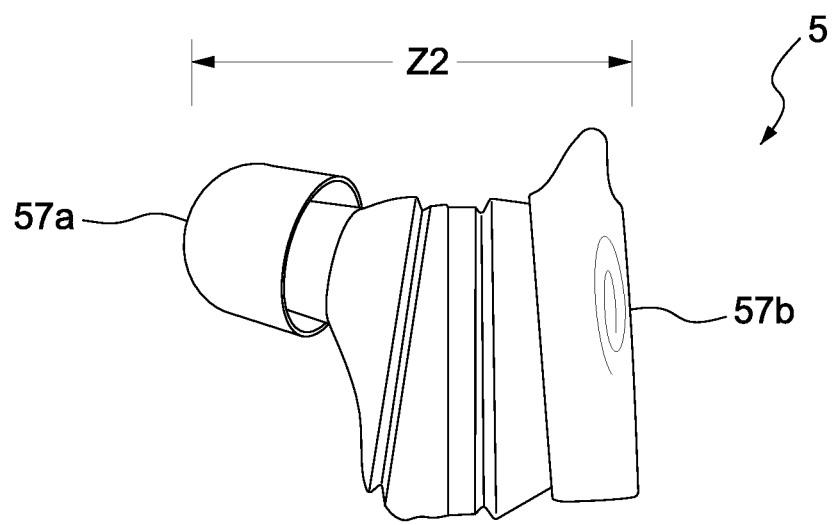
FIG. 5E illustrates a side view of an assembly of the acoustic device as shown in FIG. 5D.

FIG. 5E illustrates a side view of an assembly of the acoustic device 5 shown in FIG. 5D. In some embodiments, assuming the diameter of the speaker inside the acoustic device 5 is 6 mm, the maximum distance Z2 between an end 57a (which can be fitted or plugged into an ear) and an end 57b is equal to or larger than 23 mm. Because the thickness T1 shown in FIG. 5B is larger than the distance between an end 42a of the semiconductor device package 42 and the end 41a of the battery 41 along the z axis in FIG. 4B, the maximum distance Z2 of the acoustic device 5 is larger than the maximum distance Z1 of the acoustic device 4.

Figure 6A:
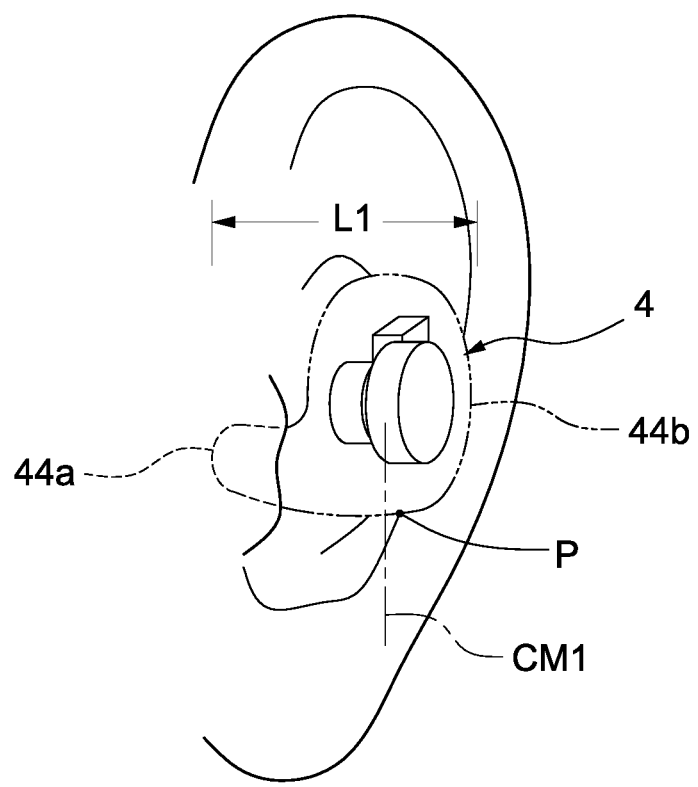
FIG. 6A illustrates an acoustic device in accordance with some embodiments of the present disclosure plugged in a human ear.

Referring to FIG. 6A, the acoustic device 4 shown in FIG. 4B is plugged into a human ear. The center of gravity CM1 may be adjacent or close to the end 44b. Due to the miniaturization of the acoustic device 4, when plugging the acoustic device 4 into the ear, the acoustic device 4 can be in contact with a point P of the ear. Accordingly, the acoustic device 4 can have a relatively good support of the ear. Accordingly, the acoustic device 4 would not easily fall out of the even when the person wearing the acoustic device 4 is moving or sweating.

Figure 6B:
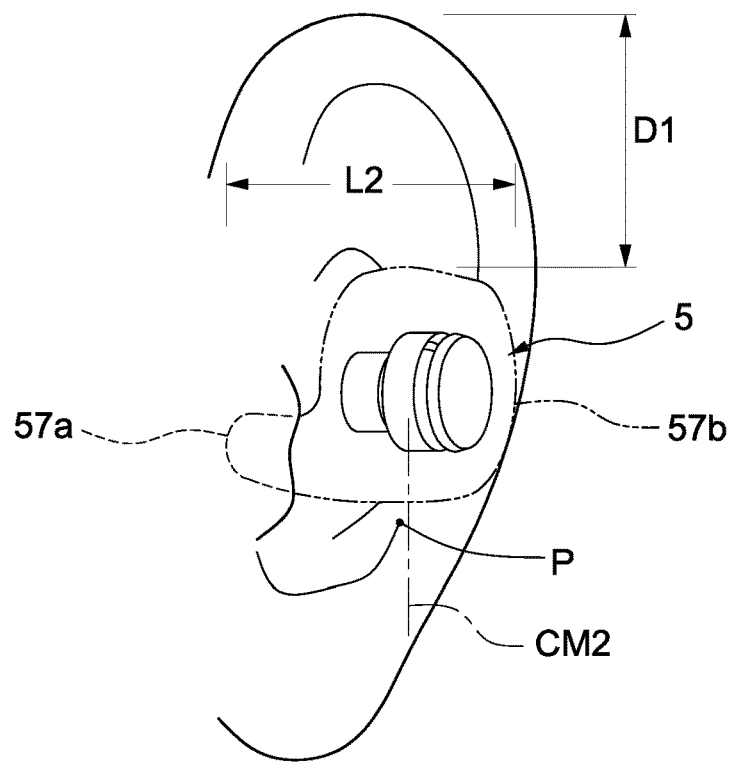
FIG. 6B illustrates an acoustic device in accordance with some other embodiments of the present disclosure plugged in a human ear.

Referring to FIG. 6B, the acoustic device 5 shown in FIG. 5E is plugged into a human ear. The center of gravity CM2 may be adjacent or close to the end 57b.

The acoustic device 5, which may have a relatively great size, may have a major portion (except the plug) that is floating. The acoustic device 5 may be spaced from the point P of the human ear. A distance D1 is between the top surface of the acoustic device 5 and the human ear.

Figure 6C:
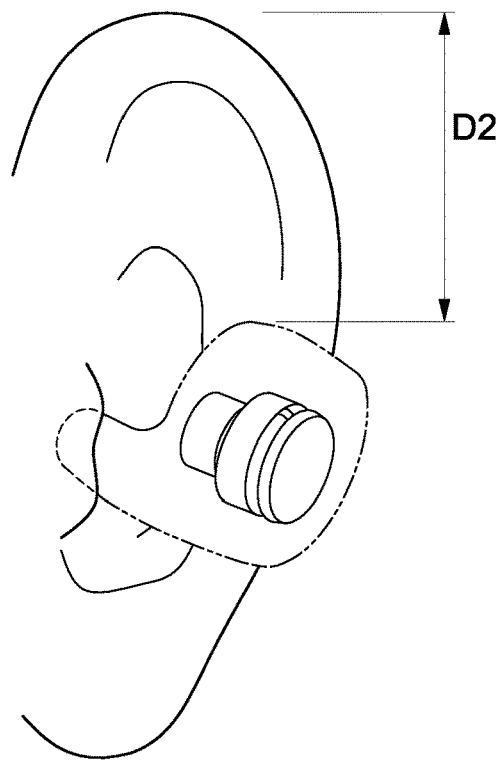
FIG. 6C illustrates the acoustic device shown in FIG. 6B falls out of the human ear.

FIG. 6C illustrates that the acoustic device 5 starts falling off the ear when the person wearing the acoustic device 5 swears, moves or change positions. The falling of the acoustic device 5 may be resulted from an unstable state as shown in FIG. 6B, in which the center of gravity CM2 may cause the acoustic device 5, which lacks support of the ear, relatively easy to fall out of the ear.

It is contemplated that a distance D2 from the top surface of the acoustic device 5 and the human ear is increasing due to the falling of the acoustic device 5. The distance D2 is larger than the distance D1.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

As used herein, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. An electronic device, comprising:
   a substrate;
   a connector disposed over the substrate;
   a feeding structure disposed over the substrate and configured to feed a radio frequency (RF) signal to an antenna; and
   a conductive pad disposed adjacent to the connector and configured to connect a speaker,
   wherein a central axis of a side of a surface of the substrate in a plan view passes the feeding structure.

2. The electronic device of claim 1, wherein the feeding structure is in contact with the antenna.

3. The electronic device of claim 2, further comprising a housing for accommodating the substrate, the connector and the feeding structure, wherein the antenna is formed on the housing.

4. The electronic device of claim 1, wherein the substrate is electrically connected to the speaker through the connector and a flexible printed circuit, wherein the flexible printed circuit connects the connector with the speaker.

5. The electronic device of claim 1, further comprising:
   an electronic component disposed under the substrate and electrically connected to the substrate; and
   an encapsulant encapsulating the electronic component and in contact with the substrate.

6. The electronic device of claim 1, further comprising a microphone and a sensor disposed between the connector and the feeding structure in the plan view.

7. The electronic device of claim 1, wherein the conductive pad is disposed between the connector and the feeding structure in the plan view.

8. The electronic device of claim 1, wherein the conductive pad is disposed outside a projection of the feeding structure toward the connector in the plan view.

9. An electronic device, comprising:
   a housing;
   a battery accommodated by the housing; and
   a device comprising:
      a substrate;
      a connector disposed over the substrate;
      a conductive pad disposed adjacent to the connector and configured to connect the battery; and
      a feeding structure disposed over the substrate and configured to feed a radio frequency (RF) signal to an antenna, wherein a height of the feeding structure is greater than a height of the connector.

10. The electronic device of claim 9, further comprising a flexible printed circuit connecting the connector with the battery.

11. The electronic device of claim 10, wherein a longitudinal direction of the flexible printed circuit is not perpendicular to a longitudinal direction of a lateral surface of the battery.

12. The electronic device of claim 10, wherein a longitudinal direction of the flexible printed circuit is non-parallel to a central axis of the battery.

13. The electronic device of claim 9, wherein the housing includes an antenna pattern, wherein the device is disposed between the antenna pattern and the battery, wherein the device is disposed outside a projection of the battery along an axial direction of the battery.

14. The electronic device of claim 13, wherein the device includes a feeding structure disposed on a first surface of the substrate and in contact with the antenna pattern, wherein the substrate has a second surface opposite to the first surface and facing the battery.

15. The electronic device of claim 9, further comprising an encapsulant encapsulating the substrate, wherein the substrate and the connector are separated from the battery by the encapsulant.

16. The electronic device of claim 9, further comprising a speaker accommodated by the housing and separated from the battery by a space, wherein the battery has a first surface facing the speaker and a second surface opposite to the first surface, wherein an extension of the second surface of the battery passes the device.

17. An electronic device, comprising:
a housing;
a speaker accommodated by the housing;
a battery accommodated by the housing, wherein the battery has a first surface facing the speaker, a second surface opposite to the first surface, and a lateral surface extending between the first surface and the second surface;
a device accommodated by the housing and comprising:
 a substrate having a first surface and a second surface opposite to the first surface; and
 an encapsulant encapsulating the first surface of the substrate; and
a flexible printed circuit disposed over the second surface of the substrate and electrically connecting the substrate to the battery and the speaker, wherein the flexible printed circuit is electrically connected to the lateral surface of the battery.

18. The electronic device of claim 17, further comprising a connector disposed on the second surface of the substrate and connecting the substrate with the flexible printed circuit.

19. The electronic device of claim 17, wherein the device further comprises a first electronic component disposed under the first surface of the substrate and encapsulated by the encapsulant, wherein the first electronic component is spaced apart from the battery by the encapsulant.

20. The electronic device of claim 17, wherein the lateral surface of the battery includes a first portion and a second portion opposite to the first portion, wherein a bottom surface of the device faces the first portion of the lateral surface of the battery, wherein the flexible printed circuit extends from a top surface of the device to the second portion of the lateral surface of the battery.

* * * * *